United States Patent [19]

Vacha et al.

[11] Patent Number: 4,874,222

[45] Date of Patent: Oct. 17, 1989

[54] HERMETIC COATINGS FOR NON-SILICA BASED OPTICAL FIBERS

[75] Inventors: Lubos J. B. Vacha; Peter C. Schultz, both of Sturbridge, Mass.; Cornelius T. Moynihan, Watervliet, N.Y.; Satyabrata Raychaudhuri, Sturbridge, Mass.; Ken C. Cadien, Pittsford, N.Y.; Barry B. Harbison, Alexandria, Va.; Reza Mossadegh, Silver Spring, Mass.

[73] Assignee: SpecTran Corporation, Sturbridge, Mass.

[21] Appl. No.: 160,545

[22] Filed: Feb. 25, 1988

Related U.S. Application Data

[63] Continuation-in-part of Ser. No. 846,331, Mar. 31, 1986, Pat. No. 4,735,856, which is a continuation-in-part of Ser. No. 74,646, Jul. 17, 1987.

[51] Int. Cl.$^4$ .......................... G02B 6/00; B05D 5/06; D02G 3/00

[52] U.S. Cl. ..................... 350/96.34; 350/96.30; 350/96.33; 427/163; 427/166; 427/403; 427/404; 428/378; 428/379; 428/384

[58] Field of Search ............... 350/96.29, 96.30, 96.33, 350/96.34; 427/163, 343, 347, 383.1, 383.3, 383.5, 403, 404, 166; 428/364, 373, 378, 384, 379

[56] References Cited

U.S. PATENT DOCUMENTS

| | | | |
|---|---|---|---|
| 2,764,510 | 9/1956 | Ziegler | 117/216 |
| 2,893,895 | 7/1959 | Claussen | 117/106 |
| 3,540,870 | 11/1970 | Li | 65/11 |
| 3,811,920 | 5/1974 | Galasso | 117/69 |
| 3,904,505 | 9/1975 | Aisenberg | 204/298 |
| 3,961,103 | 6/1976 | Aisenberg | 427/39 |
| 4,028,080 | 6/1977 | Di Vita et al. | 65/2 |
| 4,118,211 | 10/1978 | Au Coin et al. | 65/3 R |
| 4,141,741 | 2/1979 | Lucas et al. | 106/47 Q |
| 4,183,621 | 1/1980 | Kao et al. | 350/96.30 |
| 4,209,229 | 6/1980 | Rittler | 350/96.34 |
| 4,265,667 | 5/1981 | Ikeda et al. | 106/47 Q |
| 4,287,259 | 9/1981 | Riley et al. | 428/404 |
| 4,312,911 | 1/1982 | Smith et al. | 428/224 |
| 4,328,318 | 5/1982 | Miranday et al. | 501/40 |
| 4,343,638 | 8/1982 | Mitachi et al. | 65/2 |
| 4,346,176 | 8/1982 | Kanamori et al. | 501/37 |
| 4,358,543 | 11/1982 | Nozawa | 501/40 |
| 4,379,111 | 4/1953 | Smith et al. | 264/137 |
| 4,380,588 | 4/1983 | Mitachi et al. | 501/37 |
| 4,402,993 | 9/1983 | Aisenberg | 427/38 |
| 4,407,560 | 10/1983 | Wysocki | 350/96.30 |
| 4,439,008 | 3/1984 | Joorman et al. | 350/96.31 |
| 4,441,788 | 4/1984 | Guerder et al. | 350/96.34 |
| 4,445,755 | 5/1984 | Ohsawa et al. | 350/96.30 |
| 4,448,484 | 5/1984 | Lombardi et al. | 350/96.23 |
| 4,468,413 | 8/1984 | Bachmann | 427/39 |
| 4,469,724 | 9/1984 | Klinger | 427/54.1 |
| 4,473,599 | 9/1984 | Elion | 427/163 |
| 4,487,474 | 12/1984 | Nishie et al. | 350/96.21 |
| 4,504,113 | 3/1985 | Baak | 350/96.33 |
| 4,512,629 | 4/1985 | Hanson et al. | 350/96.30 |
| 4,519,826 | 5/1985 | Tran | 63/3.11 |
| 4,521,073 | 6/1985 | Murakami et al. | 350/96.34 |
| 4,525,026 | 6/1985 | Elion | 350/96.23 |
| 4,537,864 | 8/1985 | Tick | 501/30 |
| 4,539,032 | 9/1985 | Tran et al. | 65/32 |
| 4,540,601 | 9/1985 | Nath | 427/163 |
| 4,552,431 | 11/1985 | Allemand et al. | 350/96.34 |
| 4,592,932 | 6/1986 | Biswas et al. | 427/163 |
| 4,597,786 | 7/1986 | Nakai et al. | 65/2 |
| 4,627,865 | 12/1986 | Roba | 65/3.12 |
| 4,674,835 | 6/1987 | Mimura et al. | 350/96.34 |
| 4,726,319 | 2/1988 | Lindner | 427/163 X |
| 4,735,856 | 4/1988 | Schultz et al. | 350/96.30 |
| 4,750,806 | 6/1988 | Biswas | 350/96.30 |
| 4,768,859 | 9/1988 | Kasori et al. | 350/96.34 |
| 4,770,494 | 9/1988 | Csencsits et al. | 350/96.34 |
| 4,787,707 | 11/1988 | Kitayama et al. | 350/96.23 |
| 4,790,625 | 12/1988 | Biswas et al. | 350/96.33 |
| 4,812,150 | 3/1989 | Scott | 427/163 X |

FOREIGN PATENT DOCUMENTS

| | | | |
|---|---|---|---|
| 2320915 | 3/1977 | France | 350/96.34 X |
| 59-116149 | 7/1984 | Japan | 350/96.34 X |
| 2020057 | 11/1979 | United Kingdom | 350/96.34 X |
| 2164032 | 3/1986 | United Kingdom | 350/96.34 X |
| 2164033 | 3/1986 | United Kingdom | 350/96.34 X |

OTHER PUBLICATIONS

Chemical Abstracts, vol. 89, No. 26, No. 89:219732m, Dec. 25, 1978.

Tokiwa et al., A Core-Clad Composition of Crystallization-Free, Fluoride Fibers, vol. LT-3, of Lightwave Technology, Jun., 1985, pp. 569-573.

Ehrburger et al., Effect of a Titania Coating on the Tensile, Strength of Fused Silica Fiber, vol. 59, Ceramic Bulletin, pp. 844-847.

Stein et al., Ion Plasma Deposition of Hermetic Coatings for Optical Fibers, vol. 2, Advances in Ceramics, pp. 124-133.

Pinnow et al., Reductions in Static Fatigue of Silica Fibers by Hermatic Jacketing, vol. 34, Applied Physics Letters, Jan. 1979, pp. 17-19.

Stevens et al., Carbon-Coated Optical Fibers, Proceedings of the DARPA Workshop on Diamond-Like Carbon, Apr. 19-20, 1982, pp. 128-138.

Bunker et al., "Phosphate Glass Dissolution In Aqueous Solutions", J. Non-Cryst. Solids 64, (1984), pp. 291-316.

Wilder et al., "Property Variation In Alkali Alkaline-- Earth, Metaphosphate Glasses", J. Am. Cer. Soc. 67, No. 6, (1984), pp. 438-444.

Ray et al., "Oxide Glasses of Very Low Softening Point", Glass Tech. 17, No. 2, Apr. 1976, pp. 66-71.

Primary Examiner—William L. Sikes
Assistant Examiner—Brian M. Healy
Attorney, Agent, or Firm—Pennie & Edmonds

[57] ABSTRACT

A hermetically sealed optical fiber product comprising a fluoride or other non-silica based glass optical fiber and a hermetic coating of carbon, a metal, a fluoride, a metalloid or a ceramic compound in a thickness sufficient to impart moisture resistance to the optical fiber product.

37 Claims, No Drawings

HERMETIC COATINGS FOR NON-SILICA BASED OPTICAL FIBERS

CROSS REFERENCE TO RELATED APPLICATION

This application is a continuation-in-part of application Ser. No. 846,331, filed Mar. 31, 1986, now U.S. Pat. No. 4,735,856 and a continuation-in-part of application Ser. No. 074,646, filed July 17, 1987, pending.

TECHNICAL FIELD

This invention relates to new hermetic coatings for non-silica optical fiber for improving the performance thereof.

BACKGROUND ART

It is well known that bare uncoated fibers are susceptible to abrasion which results in surface scratches. These scratches can result in sudden failure through breakage of the fiber. Optical fibers are susceptible to breakage not only because they are formed from relatively brittle materials, but in addition, the fibers typically have very small diameters and are subjected to an assortment of stresses such as bending stresses, tensile stresses, and the like.

Silica base optical fibers are also susceptible to stress corrosion cracking also known as static fatigue. Microcracks in fiber surfaces present regions which are susceptible to attack by hydroxyl ions or moisture when the fiber is under stress. The combination of stress and chemical attack tends to open these cracks further. Growth of these microcracks weakens the fiber continuously over a period of time until it produces sudden failure. As mentioned above, this problem is termed static fatigue.

One approach to the problem of static fatigue is to surround the fiber with an impervious hermetic coating so that atmospheric moisture cannot reach the fiber surface. Various types of coatings have been investigated. A metallic seal of aluminum has been suggested as a hermetic coating ("Reduction in static fatigue of silica fibers by hermetic jacketing"—Pinnow, Robertson, Wysoski—Appl. Phys. Lett. 34 (1), January 1979), however, metals tend to form polycrystalline solids which can themselves be corroded by moisture or altered by enhanced grain boundary diffusion. Metal coatings also provide electrical paths along the fiber which may be undesirable and have been found to induce optical loss in the fiber through microbending.

Several non-metallic coatings have also been utilized on silica based optical fiber. For example, silicon nitride (U.S. Pat. No. 4,028,080 to DiVita et al) has been investigated as a potential coating, but silicon nitride has been seen to weaken the fiber substantially due to residual stress in the coating. Also, it is difficult to make strong fibers in long lengths with silicon nitride. Pyrolytic carbon has also been suggested in U.S. Pat. No. 4,183,621 to Kao et al and plasma deposited carbon was suggested by Stein et al ("Ion plasma deposition of carbon-indium hermetic coatings for optical fibers"—Proceedings of Conference of Laser and Electro-Optics, Washington, D.C., June 10–12, 1982). In both cases, the stress corrosion coefficient, $\eta$, of the coating was determined to be in the range of 23–30—essentially no different from that of uncoated silica. This suggests that such coatings are not hermetic. It has recently been reported that silicon carbide may serve as a hermetic coating for silica based optical fiber (U.S. Pat. No. 4,512,629 to Hanson et al). The results of investigation with silicon carbide indicate an n value of 100 or higher can be obtained.

Heavy metal fluoride glass fiber has rapidly developed to be a useful medium for mid-infrared optical transmission, and has great potential for long distance infrared optical communication. The potential of these fibers for ultra-low optical loss promises to increase the repeator spacing in long haul links, especially in undersea cables. The chemical durability of fluoride glasses is low and, therefore, the expected lifetime of fluoride fibers is substantially reduced over that of silica based fibers. Liquid water reacts readily with the fiber surface, dissolves its outer layer and eventually dissolves the entire fluoride fiber. Gaseous, atmospheric water attacks the surface, liberating hydrogen fluoride and introducing hydroxide into the fiber.

Two solutions to the above described problem have been proposed. The first one is to protect the fiber surface by an impervious hermetic coating, to prevent water or moisture from reaching the fiber surface. A common way of protecting fluoride fibers today is by applying a thin layer (i.e., about 5 to 30 microns) of a Teflon FEP coating. This layer improves the fiber handleability but does not protect against moisture migration through the coating.

The second proposed solution involves producing a core glass of mixed fluorides and cladding of chalcogenide glasses. These chalcogenide glasses are known to have better chemical durability than fluoride glasses. (McKenzie et al., Proceeding of Third International Symposium on Halide Glasses, June 24–28, 1985, Rennes, France). The important disadvantage of chalcogenide glass is its high level of toxicity, which is an impediment in medical or surgical applications. Another problem, common for both fluoride and chalcogenide glasses, is the necessity to protect them during the fiber draw by an inert atmosphere to avoid surface reaction with moisture, the creation of defects and initiation of crystallization. (Doremus—Journal of Mat. Sci. 20, 1985); (Sapsford, STL—Proc. for Soc. of Glass Technology, 1986, Scotland).

SUMMARY OF THE INVENTION

The object of this invention is to protect a non-silica based optical fiber by providing hermetic coating thereupon. Thus, the invention relates to an optical fiber product having a non-silica based optical fiber core and an encapsulating hermetic coating comprising at least one of carbon, a metal, a fluoride, a metalloid or a ceramic compound in a thickness sufficient to impart moisture resistance to the optical fiber product. Preferably, the ceramic compound has a density between about 3.2 and 6.3 g/cc, and is a carbide, nitride, boride, oxide, or mixtures thereof. Particularly advantageous hermetic coatings include carbon, boron carbide, titanium, nickel, aluminum, magnesium oxide, silicon dioxide, tantalum pentaoxide, magnesium fluoride, titanium carbide, silicon nitride, titanium nitride, titanium silicide, or thorium fluoride.

Generally, the hermetic coatings of the invention are applied by chemical vapor deposition. If desired, the fiber surface can be initially coated with a layer of carbon or boron carbide prior to applying the hermetic coating for improved performance. For certain applications, two or more of the ceramic compounds can be codeposited as a mixture, or two or more adjacent hermetic coatings of different components can be deposited upon the fiber to form the products of the invention.

Preferably, the hermetic coating has a coefficient of thermal expansion which is lower that that of the optical fiber. Preferably, this coefficient ranges between about 5.5° and $15° \times 10^{-6}°C.^{-1}$, and more preferably between about 10° and $15° \times 10^{-6}°C.^{-1}$. Other particularly advantageous hermetic coatings include, metals such as titanium, nickel, or aluminum or non-metals such as carbon or boron carbide.

The most preferred fiber comprises a fluoride glass, particularly of a mixture of zirconium, hafnium and barium fluorides. Also, the fluoride glass can include one or more fluorides of sodium, lanthanum or aluminum. A specifically useful fluoride glass formulation comprises about 25–39 mole percent $ZrF_4$, about 13–27 mole percent $HfF_4$, about 10–24 mole percent $BaF_2$, about 1–6 mole percent $LaF_3$, about 2–5 mole percent $AlF_3$, about 9–25 mole percent $NaF$ and up to 1 mole percent $InF_3$. Alternatively, chalcogenide or a $BeF_2$ glass may be used for the fiber, as well as any of the single crystal or polycrystalline materials such as thallium bromoioidide, germanium, zinc selenide, and the like. The fiber may comprise any of these materials or their variants singly or in combination as concentric layers or claddings, For certain applications, it is desirable to include an oxide coating of an alkali-borophosphate or a alkali-Group II metal-phosphate between the fiber and hermetic coating. Specifically preferred oxide glass coatings include an alkali zinc phosphate, alkali magnesium phosphate, alkali barium phosphate, alkali calcium phosphate, or mixtures thereof, and the coating should have an index of refraction which is less than that of the fiber if the fiber is to serve as an optical waveguide. The oxide coating may further comprise one or more additional glass forming oxides to increase its durability, such additional glass forming oxides including $Al_2O_3$, $TiO_2$, $ZrO_2$, $SiO_2$ or mixtures thereof.

DESCRIPTION OF THE PREFERRED EMBODIMENTS

The subject of the invention is the protection of a non-silica base, e.g., fluoride, glass optical fiber by a thin layer of hermetic coating which serves as a moisture barrier and is deposited during the draw on-line by low temperature cold deposition techniques, such as sputtering, ion beam or laser assisted deposition, RF plasma assisted CVD or evaporation, which techniques are all generally known in the art.

Coatings are chosen from a variety of ceramic, semimetallic or metallic materials which are known for protective properties on silica fibers, but which are applied by low temperature CVD techniques on fluoride fiber, taking into consideration the inherent properties of such fluoride fiber.

In the RF plasma assisted CVD embodiment of this invention, fluoride glass fiber is drawn in a draw tower equipped with a powerful vacuum pumping system which exhausts the plasma coater tube which is connected via gas tight seals to the draw furnace. In the upper part of the draw tower, the furnace is sealed around the fluoride preform using O-rings, so that no gases enter the system at this point.

The fiber passes through the RF-plasma coater equipped with a gas inlet, where different chemically reactive vapors are introduced. These vapors may be carried by a carrier gas, typically argon or helium. If the chemically reactive vapors are sourced from a material which is a gas at ambient temperature, they may be mixed directly with the carrier gas. Alternately, these chemically reactive vapors can be entrained in the carrier gas by passing the gas through a glass chamber or bubbler containing the chemically reactive material in volatile solid or liquid form. Pressure in the coater ranges from approximately 100 mTorr (initially) to approximately 300 mTorr after backfilling with the carrier gas. Vapors introduced in the coater are generated in the glass bubbler located in close proximity to the coater. Any part or all of the chemical delivery system may be heated to prevent condensation and/or to increase flow rates.

Six classes of coatings have been found suitable for use in this invention:

oxides (e.g. MgO, $SiO_2$, $Ta_2O_5$)
fluorides (e.g. $MgF_2$, $ThF_4$)
carbides (e.g. TiC, $B_4C$)
nitrides (e.g. $Si_3N_4$, TiN)
metals (e.g. Ti, Ni, Al)
metalloids (e.g. $TiSi_2$)

These coatings may be applied on any non-silica based glass fibers and preferably on the fluoride glass compositions disclosed herein. All of the examples were performed using fluoride glass optical fiber.

Advantageous fluoride glass fibers include those disclosed in U.S. Pat. No. 4,445,755, the content of which is expressly incorporated herein by reference thereto. Additional fluoride core and clad optical fiber combinations are disclosed in U.S. Pat. No. 4,674,835, the content of which is also expressly incorporated herein by reference thereto. Ranges for other suitable core and clad fluoride glasses along with specific examples follow:

| COMPONENT | RANGE (mole percent) | CORE EXAMPLE | CLAD EXAMPLE |
|---|---|---|---|
| Zr $F_4$ | 25–39 | 39 | 27 |
| Hf $F_4$ | 13–27 | 14 | 26 |
| Ba $F_2$ | 10–24 | 18 | 18 |
| La $F_3$ | 1–6 | 4 | 4 |
| Al $F_3$ | 2–5 | 3 | 3 |
| Na F | 9–25 | 22 | 22 |
| In $F_3$ | 0–1 | — | — |

It is also possible to utilize FLOX-type fibers as substrates; these fibers representing an oxide coated non-silica based fiber, typically an alkali oxide coating on fluoride glass fiber, as disclosed in copending application Ser. No. 074,646, filed July 17, 1987, entitled OXIDE COATINGS FOR FLUORIDE GLASS, the content of which is also expressly incorporated herein by reference thereto.

Specific coating requirements are provided by the following classes of materials.

(A) Coatings having a medium-to-high density of 3.2 to 6.3 g/cc. Specific Examples are:

| compound | density g/cc |
|---|---|
| MgO | 3.6 |
| $MgF_2$ | 3.2 |
| TiC | 4.9 |
| $TiSi_2$ | 4.1 |
| $ThF_4$ | 6.3 |
| Ti | 4.5 |

(B) Coatings having a thermal coefficient of expansion (TCE) of from 5.5° to $15° \times 10^{-6}°C.^{-1}$. Specific examples are:

| | |
|---|---|
| MgO | $10.5 \times 10^{-6°} C.^{-1}$ |
| MgF | $10 \times 10^{-6°} C.^{-1}$ |
| TiC | $5.5 \times 10^{-6°} C.^{-1}$ |
| TiSi$_2$ | $15 \times 10^{-6°} C.^{-1}$ |
| Ti | $8.5 \times 10^{-6°} C.^{-1}$ |

For higher temperature (100°–300° C.) deposition conditions, the upper TCE range is preferred, i.e., from about 10° to $15° \times 10^{-6}°C.^{-1}$. For lower temperature (room temperature to 100° C.) deposition conditions, the full TCE range (i.e., 5.5° to $15° \times 10^{-6}°C.^{-1}$) is appropriate.

(C) Composite (i.e., co-deposited mixtures) or sandwiched (i.e., multiple layered) coatings similar to those disclosed in U.S. Pat. No. 4,735,836, are also useful in this invention.

(D) A preferred appropriate coating thickness range is about 100 to 1000 Angstroms.

As noted above, the coatings of the present invention are useful on fluoride glass as well as other non-silica glass optical fiber. The term "non-silica based glass" is used herein to designate glass compositions which are not predominantly composed of silica. The non-silica glasses of greatest interest at this time are the heavy metal fluoride glasses, although other non-oxide glasses, such as chalcogenide glasses, and the like, are also contemplated as being within the scope of this invention.

In its most preferred arrangement, the hermetic coated optical fiber of the invention includes a conventional heavy metal fluoride glass core (with or without a cladding) coupled with an outer layer of a protective oxide glass, as disclosed in copending application Ser. No. 074,646, filed July 17, 1987, with the hermetic coatings of the invention deposited upon the protective oxide glass. The basic coating operation utilizing a chemical vapor deposition process is well known in the art and all coatings described in this invention can be deposited by this process. While it is advantageous to use the chemical vapor deposition process, the invention is operable with a number of other processes, including sputtering, vacuum deposition, plasma or the like.

Before depositing any coating on optical fiber, one has to go through the sequence of operations for a regular draw of fiber from a melt or an optical preform. This technique is well known in the art, and is illustrated, for example, in U.S. Pat. No. 4,735,836. Once the fiber draw process has been stabilized at the necessary draw speed, the process of coating the fiber with the compounds of the invention can be initiated.

EXAMPLES

The scope of the invention is further described in connection with the following examples which are set forth for the sole purpose of illustrating the preferred embodiments of the invention and are not to be construed as limiting the scope of the invention in any manner.

EXAMPLE 1

TiC Coating

TiCl$_4$ is the volatile gas material used as a source of titanium and is contained in the bubbler. Helium is used as a carrier gas with acetylene (C$_2$H$_2$) as the source of carbon. Starting pressure is 125 mTorr and the flow is 20–50 cc/min. The pressure after backfilling is 320 mTorr. Plasma is initiated at 100 W power and TiC coating is deposited on the fluoride glass. Draw furnace temperature is 360° C., with a drawing speed of 3–5 m/min.

EXAMPLE 2

TiSi$_2$ Coating

TiCl$_4$ as a volatile liquid material and SiCl$_4$ as a second volatile liquid material are placed in two separate bubblers. Their vapors are carried by He into the coater, and plasma is initiated at vacuum conditions similar to those of Example 1. A TiSi$_2$ coating is deposited on the fiber.

EXAMPLE 3

MgO/F Coating

Magnesium hexafluoroacetylacetonate 1,2-dimethoxyethane complex is placed into a glass bubbler. This material is a solid powder which melts at a temperature of about 70° C. The vapors are carried by He into the coater through a heated delivery tube. The complex decomposes in the plasma, thus depositing a MgO/F compound as a coating on the fiber.

EXAMPLE 4

MgO/F Coating

Magnesium hexafluoroactelyactonate—tetrahydrofuran is placed into a glass bubbler. This material is a solid powder which melts at a temperature of about 70° C. The vapors are carried by He into the coater through a heated delivery tube. The complex decomposes in the plasma, thus depositing a MgO/F compound as a coating on the fiber.

Other preferred coatings offering the desired moisture barrier properties include: MgO, MgF$_2$, ThF$_4$, and Ti. These coatings are preferably applied by evaporation.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

What is claimed is:

1. An optical fiber product having a non-silica based optical fiber and an encapsulating hermetic coating comprising at least one of carbon, an inorganic fluoride, a metalloid or a ceramic compound in a thickness sufficient to impart moisture resistance to said optical fiber product.

2. The product of claim 1 wherein the ceramic compound has a density between about 3.2 and 6.3 g/cc.

3. The product of claim 2 wherein the ceramic compound is a carbide, nitride, boride, oxide, or mixtures thereof.

4. The product of claim 1 wherein the hermetic coating comprises magnesium oxide, silicon dioxide, tantalum pentoxide, magnesium fluoride, thorium fluoride, titanium carbide, boron carbide, silicon nitride, titanium nitride, or titanium silicide.

5. The product of claim 1 wherein said optical fiber comprises a core and a cladding which has a refractive index that is different than the core, and wherein said hermetic coating is applied by chemical vapor deposition.

6. The product of claim 2 which further comprises initially coating the optical fiber with a layer of carbon or boron carbide prior to applying the hermetic coating.

7. The product of claim 2 wherein two or more of said ceramic compounds are codeposited as a mixture.

8. The product of claim 1 wherein two or more adjacent hermetic coatings of different components are deposited upon said optical fiber.

9. The product of claim 1 wherein said hermetic coating has a coefficient of thermal expansion of between about $5.5°$ and $15° \times 10^{-6} °C.^{-1}$.

10. The product of claim 1 wherein said hermetic coating has a coefficient of thermal expansion of between about $10°$ and $15° \times 10^{-6} °C.^{-1}$.

11. The product of claim 1 wherein the optical fiber comprises fluoride or chalcogenide glass.

12. The product of claim 11 wherein the fluoride glass comprises about 52-69 mole percent $ZrF_4$, about 10-24 mole percent $BaF_2$, about 1-7 mole percent $LaF_3$, about 2-5 mole percent $AlF_3$ and about 9-25 mole percent NaF.

13. The product of claim 12 wherein the total content of $ZrF_4$, $BaF_2$, $LaF_3$ and NaF in the fluoride glass is greater than 90 mole percent.

14. The product of claim 11 wherein the fluoride glass comprises a mixture of zirconium, hafnium and barium fluorides.

15. The product of claim 14 wherein the fluoride glass further comprises one or more of sodium, lanthanum or aluminum fluorides.

16. The product of claim 11 wherein the fluoride glass comprises about 25-39 mole percent $ZrF_4$, about 13-27 mole percent $HfF_4$, about 10-24 mole percent $BaF_2$, about 1-6 mole percent $LaF_3$, about 2-5 mole percent $AlF_3$, about 9-25 mole percent NaF and up to 1 mole percent $InF_3$.

17. The product of claim 1 wherein the glass fiber comprises a fluoride glass core and fluoride glass cladding having an index of refraction which is different from that of the core.

18. An optical fiber product having a non-silica glass core; an oxide coating of an alkali-boro-phosphate or an alkali-group II metal phosphate; and an encapsulating hermetic coating comprising at least one of carbon, a metal, a fluoride, a metalloid or a ceramic compound in a thickness sufficient to impart moisture resistance to said optical fiber product.

19. The product of claim 18 wherein the oxide glass is an alkali zinc phosphate, alkali magnesium phosphate, alkali barium phosphate, alkali calcium phosphate, or mixtures thereof.

20. The product of claim 18 wherein the oxide glass coating has an index of refraction which is less than that of the glass fiber.

21. The product of claim 18 wherein the oxide glass coating has a coefficient of thermal expansion which is lower than that of the optical fiber to produce a compressive oxide cladding for increased fiber strength.

22. The product of claim 18 wherein the oxide glass coating further comprises one or more additional oxides to increase the durability of the coating.

23. The product of claim 22 wherein the additional oxide is $Al_2O_3$, $TiO_2$, $ZrO_2$, $SiO_2$ or mixtures thereof.

24. The product of claim 1 wherein the hermetic coating has a thickness of between about 100 and 1000 angstroms.

25. An optical fiber product having a non-silica optical fiber and an encapsulating hermetic coating comprising at least one of carbon, a metal, a metalloid, or a ceramic compound having a density of between about 3.2 and 6.3 g/cc, said hermetic coating having a coefficient of thermal expansion of between about $5.5°$ and $15° \times 10^{-6} °C.^{-1}$ and being present in a thickness sufficient to impart moisture resistance to the optical fiber product.

26. An optical fiber product comprising: a core of a fluoride glass comprising about 25-39 mole percent $ZrF_4$, about 13-27 mole percent $HfF_4$, about 10-24 mole percent $BaF_2$, about 1-6 mole percent $LaF_3$, about 2-5 mole percent $AlF_3$, about 9-25 mole percent NaF and 0 to 1 mole percent $InF_3$; a fluoride glass cladding adjacent said core; an oxide glass coating of an alkali-borophosphate or an alkali-group II metal-phosphate adjacent said cladding; and an encapsulating hermetic coating comprising at lest one of carbon, a metal, a metalloid, or a ceramic compound having a density of between about 3.2 and 6.3 g/cc, said hermetic coating having a coefficient of thermal expansion of between about $5.5°$ and $15° \times 10^{-6} °C.^{-1}$ and being present in a thickness sufficient to impart moisture resistance to the optical fiber product.

27. The product of claim 1 which further comprises a coating of an oxide glass between said glass fiber and said hermetic coating.

28. The product of claim 27 wherein said oxide glass is an alkali-boro-phosphate or an alkali-group II metal phosphate.

29. The product of claim 1 wherein said non-silica glass is a fluoride glass, a chalcogenide glass, $BeF_2$, a single crystal material, a polycrystalline material, germanium, or a selenide glass.

30. The product of claim 18 wherein said non-silica glass is a fluoride glass, a chalcogenide glass, $BeF_2$, a single crystal material, a polycrystalline material, germanium, or a selenide glass.

31. The product of claim 25 wherein said non-silica glass is a fluoride glass, a chalcogenide glass, $BeF_2$, a single crystal material, a polycrystalline material, germanium, or a selenide glass.

32. An optical fiber product having a non-silica glass optical fiber core of a selenide glass, germanium, $BeF_2$, a chalcogenide glass, or a fluoride glass having (a) about 52-69 mole percent $ZrF_4$, about 10-24 mole percent $BaF_2$, about 1-7 mole percent $LaF_3$, about 2-5 mole percent $AlF_3$ and about 9-25 mole percent NaF or (b) about 25-39 mole percent $ZrF_4$, about 13-27 mole percent $HfF_4$, about 10-24 mole percent $HfF_4$, about 10-24 mole percent $BaF_2$, about 1-6 mole percent $LaF_3$, about 2-5 mole percent $AlF_3$, about 9-25 mole percent NaF and up to 1 mole percent $InF_3$; and an encapsulating hermetic coating comprising at least one of carbon, a metal, a fluoride, a metalloid or a ceramic compound in a thickness sufficient to impart moisture resistance to said optical fiber product.

33. The product of claim 32 which further comprises a coating of an oxide glass between said glass fiber and said hermetic coating.

34. The product of claim 33 wherein said oxide glass is an alkali-boro-phosphate or an alkali-group II metal phosphate.

35. The product of claim 32 wherein the hermetic coating has a thickness of between 100 and 1000 angstroms, and wherein the metal hermetic coating is titanium, nickel or aluminum.

36. The product of claim 25 wherein the hermetic coating has a thickness of between 100 and 1000 angstroms, and wherein the metal hermetic coating is titanium, nickel or aluminum.

37. The product of claim 26 wherein the hermetic coating has a thickness of between 100 and 1000 angstroms, and wherein the metal hermetic coating is titanium, nickel or aluminum.

* * * * *